US008661382B2

(12) United States Patent
Lamb

(10) Patent No.: US 8,661,382 B2
(45) Date of Patent: Feb. 25, 2014

(54) MODELING FOR SOFT ERROR SPECIFICATION

(75) Inventor: Kirk David Lamb, Kingston, NY (US)

(73) Assignee: International Business Machines Corporation, Armonk, NY (US)

( * ) Notice: Subject to any disclaimer, the term of this patent is extended or adjusted under 35 U.S.C. 154(b) by 587 days.

(21) Appl. No.: 12/637,016

(22) Filed: Dec. 14, 2009

(65) Prior Publication Data

US 2011/0145771 A1  Jun. 16, 2011

(51) Int. Cl.
G06F 17/50 (2006.01)
G06F 11/22 (2006.01)
G06G 7/62 (2006.01)

(52) U.S. Cl.
USPC ........... 716/106; 716/111; 716/112; 716/136; 703/13

(58) Field of Classification Search
None
See application file for complete search history.

(56) References Cited

U.S. PATENT DOCUMENTS

| | | | | |
|---|---|---|---|---|
| 6,766,274 | B2* | 7/2004 | Puthucode | 702/181 |
| 7,320,114 | B1* | 1/2008 | Jain et al. | 716/106 |
| 7,401,311 | B2* | 7/2008 | Voldman | 716/115 |
| 7,644,311 | B2* | 1/2010 | Lien et al. | 714/37 |
| 2003/0028352 | A1* | 2/2003 | Puthucode | 702/181 |
| 2004/0187050 | A1* | 9/2004 | Baumann et al. | 714/704 |
| 2008/0016477 | A1* | 1/2008 | Kleinosowski et al. | 716/4 |
| 2009/0193296 | A1* | 7/2009 | Kellington et al. | 714/33 |
| 2011/0055777 | A1* | 3/2011 | Tremaine et al. | 716/106 |

OTHER PUBLICATIONS

R. Leveugle et al., Early SEU Fault Injection in Digital, Analog and Mixed Signal Circuits: A Global Flow, Proceedings of the Design, Automation and Test in Europe Conference and Exhibition, pp. 590-595, 2004.*

T. Karnik et al., Characterization of Soft Errors Causes by Single Event Upsets in CMOS Processes, IEEE Transactions on Dependable and Secure Computing, pp. 128-143, Jun. 2004.*

Nguyen et al. "A Systematic Approach to SER Estimation and Solutions", IEEE 41st Annual International Reliability Physics Symposium, Dallas, Texas, 2003, pp. 60-70.

Mitra "Circuit Failure Prediction for Robust System Design in Scaled CMOS", IEEE 46th Annual International Reliability Physics Symposium, Phoenix, 2008, pp. 524-531.

Maheshwari et al "Accurate Estimation of Soft Error Rate (SER) in VLSI Circuits", Proceedings of the 19th IEEE International Symposium on Defect and Fault Tolerance in VLSI Systems, pp. 1-9.

Srinivasan et al. "Improving Soft-error Tolerance of FPGA Configuration Bits", Computer Aided Design 2004, IEEE/ACM International Conference. Nov. 2004, pp. 107-110.

Freeman "Critical Charge Calculations for a Bipolar SRAM Array", IBM Journal of Research and Development, vol. 40, No. 1, Jan. 1996, pp. 119-129.

* cited by examiner

Primary Examiner — A. M. Thompson
(74) Attorney, Agent, or Firm — Steven Chiu

(57) ABSTRACT

Soft error modeling of circuits. Soft error upset (SEU) specification and design information is received from a design entry. The SEU specification comprises expected SEU behavior of a node. A logical simulation model is created based on the SEU specification and the design information. A logical verification is performed based on the logical simulation model to produce a first result. The logical verification comprises selecting a first node for injection, injecting an SEU into the first node to produce a first result, and responsive to the first result not agreeing with the SEU specification, providing the first result to the design entry. A netlist based on the SEU specification and the design information is created. The netlist comprises a specification-based-logic-derating derived from the SEU specification. A physical design verification based on the netlist, a logic derating, and clock information is performed. It comprises calculating node failure-in-time based on the specification-based-logic-derating.

17 Claims, 8 Drawing Sheets

| SELF HEALED ATTRIBUTE | ERROR CORRECTION ATTRIBUTE | ERROR DETECTION ATTRIBUTE | |
|---|---|---|---|
| | | EDN | EDY |
| SHN | ECN | SDC | URA |
| SHN | ECY | UNEXPECTED | SRA |
| SHY | ECN | SDC | URA |
| SHY | ECY | UNEXPECTED | FR |

FIG.1

| SELF HEALED ATTRIBUTE | ERROR CORRECTION ATTRIBUTE | ERROR DETECTION ATTRIBUTE | | | |
|---|---|---|---|---|---|
| | | EDN | EDP | EDDED | EDOH |
| SHN | ECN | SDC | URA | URA | URA |
| | ECSEC | UNEXPECTED | SRA | SRA | SRA |
| SHUA | ECN | SDC | URA | URA | URA |
| | ECSEC | UNEXPECTED | FR | FR | FR |
| SHR | ECN | SDC | URA | URA | URA |
| | ECSEC | UNEXPECTED | FR | FR | FR |

FIG.2

| SELF HEALED ATTRIBUTE | ERROR CORRECTION ATTRIBUTE | ERROR DETECTION ATTRIBUTE | | | |
|---|---|---|---|---|---|
| | | EDN | EDP | EDDED | EDOH |
| SHN | ECN | 1 | 1 | 1 | 1 |
| | ECSEC | 1 | 0 | 0 | 0 |
| SHUA | ECN | 1 | 1 | 1 | 1 |
| | ECSEC | 1 | 0 | 0 | 0 |
| SHR | ECN | 1 | 1 | 1 | 1 |
| | ECSEC | 1 | 0 | 0 | 0 |

FIG.3

MODELING FOR SOFT ERROR SPECIFICATION

BACKGROUND

This invention relates, in general, to soft error rate (SER) estimation, and, in particular, to enabling accurate estimation and validation for integrated circuits (IC or chip) and Application Specific Integrated Circuits (ASIC) or other circuits used in digital system design.

Various subcircuits in integrated circuits and ASICs, such as register files, latches, and memory buffers, store data that is subject to corruption by soft errors (SE). SE occurs, for example, when ionizing radiation causes a latch or node in a memory array to invert its logical value. Most hardware has embedded logic to detect, correct, and log such errors and notify the software of such an event through exceptions. Instruction set simulators (ISS) are often used to verify the proper functioning of the chip in connection with virtual IC modeling the physical implementations of the chip. However, due to the inherently random nature of SE events and because these events are not always coupled with a specific instruction, the ISS or reference architecture cannot model these SE events. This presents a challenge in verifying hardware functionality pertaining to detection, and logging such errors, referred to collectively as SE handling.

Typically, the hardware logic associated with SE handling is verified with short directed self-checking tests. Such directed tests involve testing a very specific error type in a diagnostic program, e.g., just one instruction cache error, and comparing the expected results with the actual error log generated by the SE handling logic. This approach is inadequate for multi-threading processors because of the presence of multiple concurrent threads, which could be executing completely independent programs. Here, the proper error handling by the error encountering thread could be hampered by events on other threads. Furthermore, an error on one thread could leak to another thread causing spurious logging or functional incorrectness. For example, if a thread sees an error which is then improperly reported to a different thread, the second thread will behave as if the error occurred during execution of its own program, potentially resulting in data corruption.

An article entitled "A Systematic Approach to SER Estimation and Solutions" by Hang T. Nguyen and Yoad Yagil, IEEE 41st Annual International Reliability Physics Symposium 2003, describing soft errors, processor architecture, and failure in time (FIT) rate calculation is hereby incorporated in its entirety herein by reference.

Typically, SE FIT prediction is estimated early in the design phase using spreadsheets or similar tools, based on fairly coarse granularity estimates at the macro or chip level, rather than at the node level. This enabled early estimation of SE FIT, but had a large margin of error, was labor intensive, and was not regressible in the sense that if the design changed, the work could not easily be modified to account for the changes. A more accurate estimate was available late in the design phase, using a fault grading (FG) tool, but since it was late in the design phase any defects related to soft error upset (SEU) could not be corrected, or could only be corrected at relatively high cost. For convenience purposes, the term "soft error", "soft error upset", and their respective acronyms are used interchangeably. Cost is measured in money, time, or engineering effort, and it is generally recognized that defects found late in a design cycle require more to correct than those found early. As circuit densities increase, the probability that a SEU will affect the correct operation of a given circuit generally increases.

BRIEF SUMMARY

According to one embodiment of the present invention, a computer implemented method, system and program product is provided for soft error modeling of circuits. A soft error upset (SEU) specification and design information is received from a design entry. The SEU specification comprises expected SEU behavior of a node. A logical simulation model is created based on the SEU specification and the design information. A logical verification is performed based on the logical simulation model to produce a first result. The logical verification comprises selecting a first node for injection, injecting an SEU into the first node to produce a first result, and responsive to said first result not agreeing with said SEU specification, providing the first result to the design entry.

According to one embodiment of the present invention, a netlist is created based on the SEU specification and the design information. The netlist comprises a specification-based-logic-derating derived from the SEU specification. A physical design verification is performed based on the netlist, a logic derating, and clock information. The physical design verification comprises calculating node failure-in-time (FIT) based on the specification-based-logic-derating.

According to one embodiment of the present invention the first result consists of any one of a logical defects result, an experimentally determined attributes result, or a verification result.

According to one embodiment of the present invention, a second result responsive to the physical design verification is produced. The second result comprises one of a physical defects result or a calculated circuit soft-error-rate-failure-in-time-rating. The circuit soft-error-rate-failure in-time-rating comprises summing the node failure-in-time. The second result is provided to the design entry.

According to one embodiment of the present invention, the netlist comprises a node type.

According to one embodiment of the present invention, the node is any one of a latch, a wire, a transistor gate, a logic element, a memory array, or a register array.

According to one embodiment of the present invention, performing the logical verification further comprises comparing the SEU specification with a behavior of the injected SEU node.

According to one embodiment of the present invention, the SEU specification comprises an attribute selected from the group consisting of a self healed attribute, an error correction attribute, and an error detection attribute.

BRIEF DESCRIPTION OF THE SEVERAL VIEWS OF THE DRAWINGS

FIG. 1 illustrates an example of error detection, error correction, and self healing (EDECSH) specifications and the resulting system condition in the event of an SEU;

FIG. 2 illustrates an example of EDECSH attributes where the types of error detection, correction, and self healing are specified;

FIG. 3 illustrates an example of the specification-based logic derating (SLD) that would be applied in FIT calculation for the example shown in FIG. 2;

DETAILED DESCRIPTION

Figure 4:
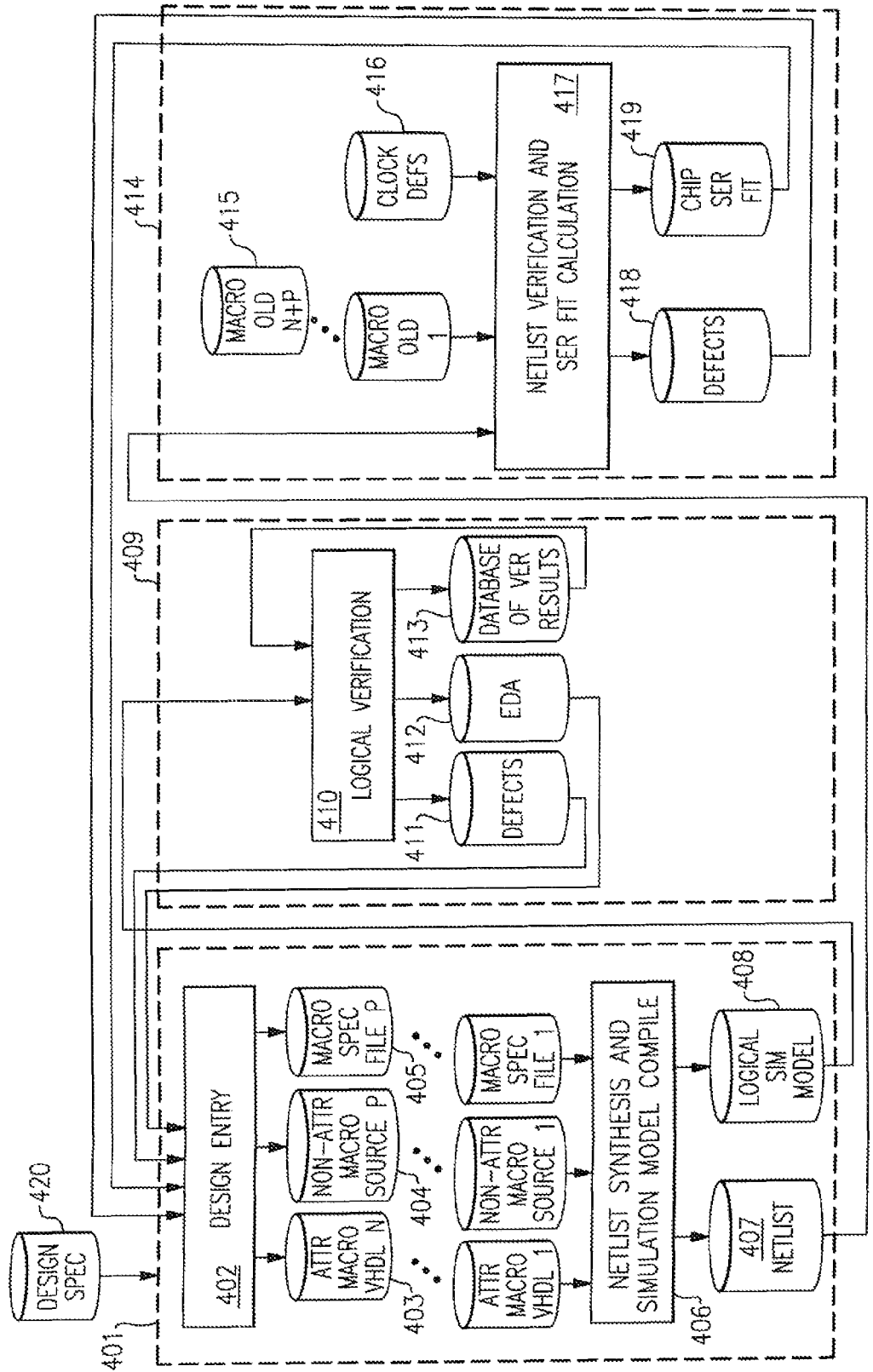
FIG. 4 illustrates an embodiment of the closed loop process of design entry, logical and physical verification of SEU specification.

In accordance with an embodiment of the present invention, an integrated system, methodology, and program product for front end design employing a node-based SEU specification is provided. For description purposes, the embodiment's attributes are stated to be applied to latches in the design, but may also be applied to any node such as a wire, transistor gate, logic element, memory array, register array, latch, etc of the system without any changes to the essence of the invention.

One embodiment of the present invention introduces a node-based SEU specification, to be attributed uniquely to each latch, which specifies the behavior of the latch relative to an SEU in the categories of error detection, error correction, fault isolation, and self-healing (EDECFISH). This specification enables logical verification of the specification, targeted design changes to improve soft error tolerance, and accurate, regressible calculations of FIT rate due to soft errors. The EDECFISH attributes specifies whether or not the SEU will be detected and, if necessary, corrected. It specifies whether and where the SEU will be isolated for defect identification and repair purposes. It specifies whether the latch will self-heal or not. A latch that self-heals will return to a valid state without firmware or software intervention.

In an example, there are different types of soft errors known in the art which include: 1) those that are detected and corrected, 2) those that are detected but not corrected, and 3) those that are undetected. For high reliability, availability, and serviceability design, these are necessary but not sufficient to describe soft errors. One embodiment of an EDECFISH specification, but without the fault isolation category, is described with reference to FIG. 1. This specification includes an error detection, error correction, and self-healing category (EDECSH). As illustrated in FIG. 1, these categories result in the following possible system conditions:

1) error not detected (EDN), error not corrected (ECN), and error not self healed (SHN) which results in a possible silent data corruption (SDC);

2) EDN, ECN, and error self healed (SHY) which results in SDC;

3) error detected (EDY), ECN, and SHN which results in a possible unscheduled repair action (URA);

4) EDY, ECN, and SHY which results in a possible URA;

5) EDY, ECY, SHN which results in a scheduled repair action (SRA);

6) EDY, ECY, SHY which results in fully recovered (FR);

7) EDN, ECY, SHN which results in an unexpected SE tolerance specification (UNEXPECTED); and 8) EDN, ECY, SHY which results in UNEXPECTED.

The EDECSH specification is unique for each latch. The specification categories may be customized per system, reflecting the level of specificity the system design specification requires. In the simplest version, they may each be of a yes or no form, indicating that an SEU would be detected (EDY) or not (EDN), corrected (ECY) or not (ECN), and self-healed (SHY) or not (SHN) as illustrated in FIG. 1. The categories are not limited to the ones listed above. They may include a list of all the error detector types which would detect the error. Possible examples of other error detection specifications are parity, double-error detection of an error correcting code scheme, or a one-hot check of a finite state machine. The error detection (ED) specification could be expanded to cover any type of error detector implemented in the design. The same applies to the error correction (EC) and self-healing specifications. The categories may further include a fault isolated (FI) category which may also be in a yes (FIY) or no (FIN) form. The specification with the inclusion of the FI category is known as EDECFISH, which was previously described earlier. The FI specification may also be specific enough to indicate which fault isolation register bit would record the effect of an SEU.

FIG. 2 is similar to FIG. 1, however FIG. 2 illustrates a system that has the three previously described ED specifications, single error correction (ECSEC), and two types of self-healing. Self-heal unassisted (SHUA) describes latches that clear the SEU without software or firmware intervention. Self-heal recovery (SHR) describes latches that clear the SEU when the hardware goes through a recovery action upon error detection.

Assuming that latches are used to calculate the chip FIT rate due to SEU, the equation: chip FIT=$\Sigma$Nominal FIT*LD*TD is applied, where the summation is over all latches in the design, LD represents logic derating, and TD represents time derating. The nominal FIT, which is unique to each latch type in a particular technology, represents the probability that an SEU will cause a false transition on the latch. TD indicates the percentage of time that the latch is susceptible to an SEU from the point of view of clocking. Standard TD eliminates the time a master or slave latch is flushing from the time a latch is susceptible. For latches with a clock at 50% duty cycle, the TD would be 0.5 for both master and slave. LD indicates the percentage of time that the latch is logically susceptible to contribute to the FIT rate in the event of an SEU. For example, if logical verification found that a given buffer was, on average, only 30% utilized, then the LD for any latch which made up that buffer would be 0.3.

By applying the SEU specification of the embodiment of the present invention, the FIT calculation equation is modified to: chip FIT=$\Sigma$Nominal FIT*SLD *OLD*TD, where nominal FIT and TD are the same as defined previously. LD now comprises a specification-based logic derating (SLD), which is determined by a table look-up using the EDECFISH specification of the latch, and an optional logic derating (OLD). The OLD defaults to 1, but can be assigned any value between and including 0 and 1. The OLD would be used to reflect the 30% buffer utilization of the previous example. The SLD for the example of FIG. 2 is shown in FIG. 3.

In addition to the node based specification, this embodiment of the present invention describes a closed loop design methodology for verifying the logical specification, calculating an accurate FIT rate using the specification, the design netlist, and clock frequency and duty cycle information, and detecting both logical and physical defects related to SEU and feeding them back to designers for correction. By applying this process, a design team would achieve an optimal SE FIT rate for a particular design, given the constraints of a particular technology, staffing, and time available for completion. Since the process is closed loop with feedback, the design team would either correct every fed back defect and achieve an optimal FIT rate, or assess some defects and choose to not correct them due to schedule or other constraint, such as chip power or area. But given sufficient time, the design team would achieve either an optimal FIT rate or a design with a known set of SEU defects that it chooses to not correct.

FIG. 4 illustrates an embodiment of the present invention. More specifically, illustrated is an embodiment of a closed loop process for specifying the behavior of latches and applying an optional logic derating, verifying the specification in both logical and physical design, and calculating a derated SE FIT rate. This process has feedback from both the logical and physical verification processes into the design process. It is a regressible process, and as defects are fed back and corrected it converges to a stable solution producing an optimal SE FIT rate.

During the design entry and SEU specification process 401, latches are attributed to specify latch behavior for when latch value changes due to a SEU. A design spec 420 is inputted into the design entry 402. The design entry 402 produces two general types of outputs: attributed source files (for example, attributed VHDL) 403 and non-attributed design source files (for example, anything other than attributed VHDL) 404, 405. VHDL allows a user to define attributes, thus allowing an SEU specification to be assigned to each latch through the attribute. For other design languages that do not support the attribute concept, or for inferred latches, the specification can be provided in a separate file, listing each latch of the netlist and the associated specification. There may be N macros implemented in attributed VHDL 403. There may also be P non-attributed source files 404 along with P specification files 405, with one specification file per macro file. These design source files are provided to a Netlist Synthesis and Simulation Model 406, which produces two outputs: a netlist 407 and a logical simulation model 408. The logical simulation model 408 is an input to the logical verification process 409, which is shown in further detail in FIG. 5. The logical verification process 409, based on stimulus exercising the logic simulation model 408, produces three outputs: defects 411 which are fed back to the design entry process for correction, experimentally determined attributes (EDA) stored in an EDA database 412 which can also be fed back to the design entry process, and an optional database of verification results 413. The netlist 407 is an input to the netlist verification and SER FIT calculation process 414, along with optional logic derating data for each of the macros 415, and clock definitions 416. The netlist verification and SER FIT calculation process produces 414 two outputs: defects 418 which are fed back to the design entry process, and a calculated chip SER FIT rating 419, also fed back to the design entry and SEU specification process 401.

Figure 5:
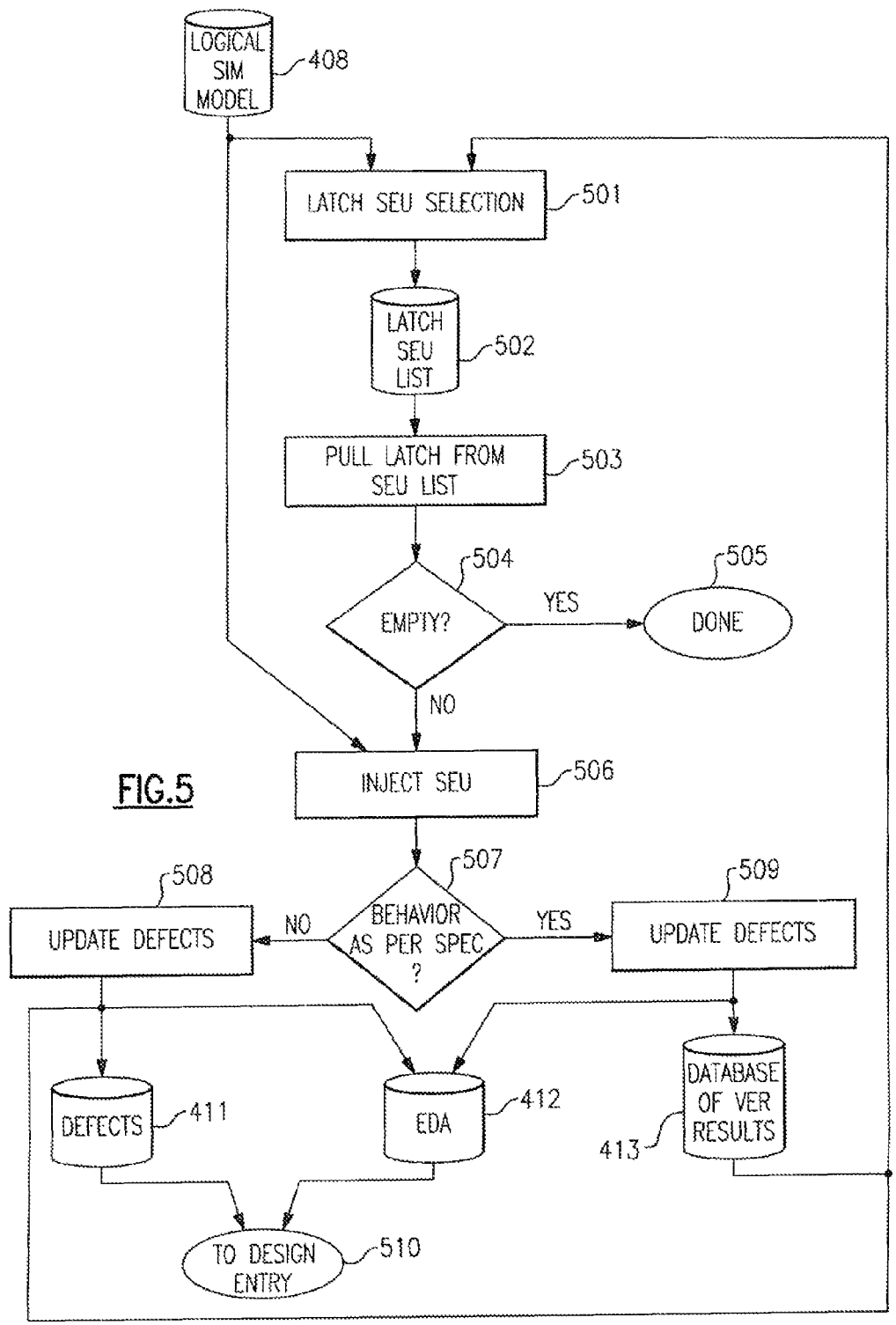
FIG. 5 illustrates an embodiment of the logical verification process.

Further details regarding the logical verification process 409 in FIG. 4 is described with reference to FIG. 5. The logical simulation model 408, which is the result of design entry and SEU specification process 401, is the input into the logical verification process. First, a list of designed latches for SEU injection is selected in latch SEU selection 501. This may be done by a variety of algorithms, which depends on the number of latches in the design and the amount of effort allocated for the task. One such algorithm would be to select all of the designed latches. However, the algorithm itself is not part of the embodiment of this invention. After a list of latches is selected 502, each latch is pulled one by one from the SEU list, 503. The list is checked to see if it is empty 504. If the list is empty, the logical verification process is finished, 505. If the list is not empty, SEU are injected one at a time into each of the latches, until the list is exhausted, 506. After each SEU is injected, the simulation environment has a monitor to determine whether the specification was correct 507. The injected error was either detected or not, corrected or not, fault isolated or not, and the latch either healed or it did not. Other categories specified in the specification may also be monitored. Thus, logical correctness of the latch SEU specification is verified. If the behavior is as specified, the latch is considered verified, and will be stored in a database 509 (database itself is represented by the Database of Ver Results 413). Optionally, the database of verification results 413 may be used as an input into the latch SEU selection 501, so that latches that have been already verified are not again selected for verification, or are selected only if the design changes. If the behavior is not as specified, it is considered a defect and stored in a defects database 508 (database itself is represented by Defects 411). The defect is then passed back to the design entry and SEU specification process 401 for correction. Regardless whether the behavior is or is not as specified, the latch may be added to an optional EDA database 412. The EDA database 412 may also be fed back to the design entry and SEU specification process 401 for use by designers. Designers may use this EDA information to assign specifications based on their assessment of an EDA. The logical verification process may either specify forward (designers assigning a specification for logical verification to prove true or false) or specify backward (logical verification telling designers how a particular latch behaves relative to SEU).

Figure 6:
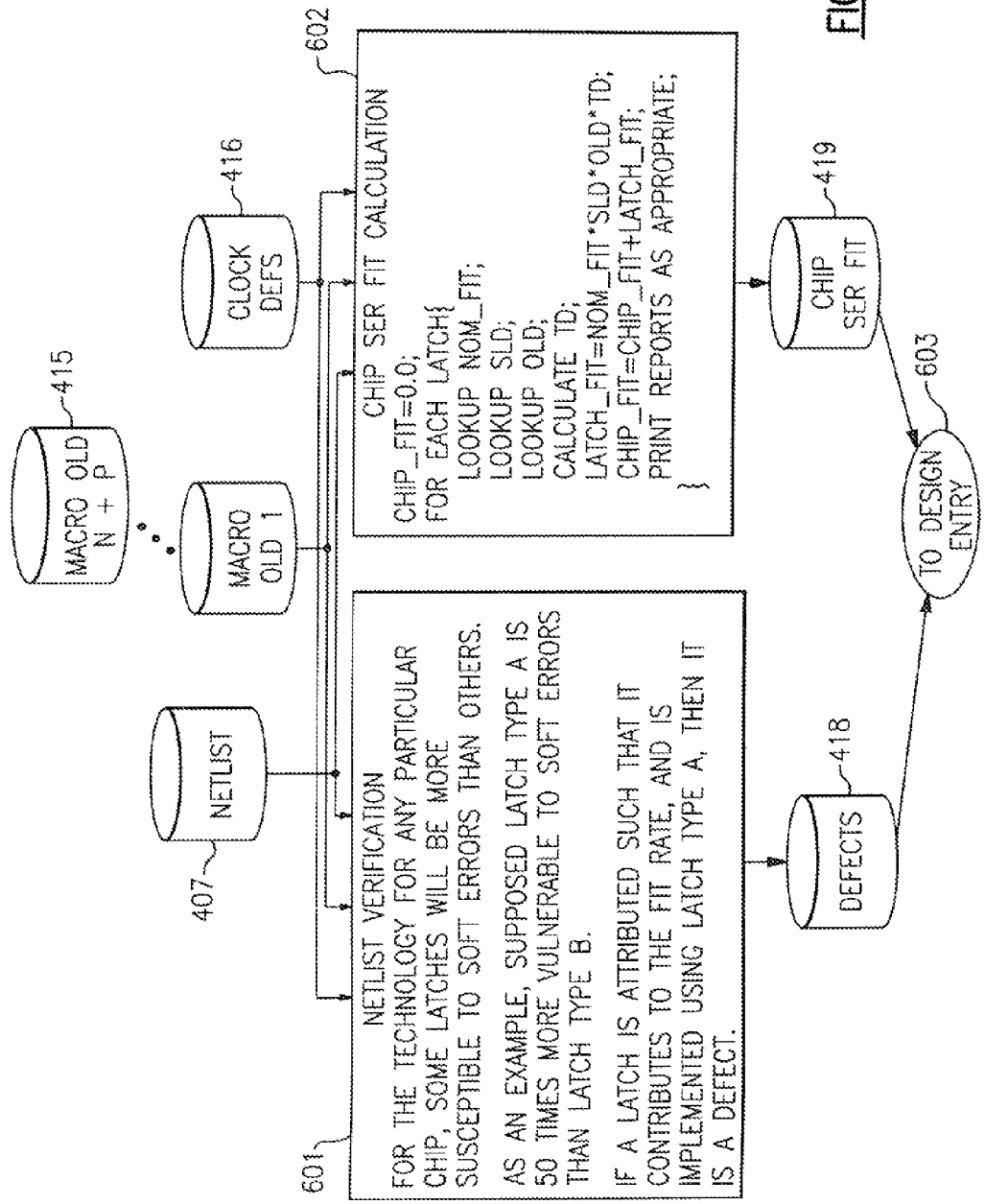
FIG. 6 illustrates an embodiment of the physical verification process.

Further details regarding the physical verification and SE FIT calculation process 414 in FIG. 4 is described with reference to FIG. 6. The netlist 407 is provided to the physical design process from the design entry process. The latch SEU specifications are included in the netlist, so the physical verification process has both the latch type and the latch SE specification. Multiple OLDs 415 (P+N) as well as frequencies and duty cycles of the clocks which feed the latches 416 are also provided as inputs to the physical verification process. This enables the physical verification process verify the netlist and to calculate an accurate SE FIT rate. During netlist verification 601, latches are checked to see if their attributes contributes to the FIT rate. The latch type is used to determine if there may be a defect. Due to the technology for any particular chip, some latches may be more susceptible to soft errors than others. For example of a defect would be if a latch had an SLD*OLD equal to one, indicating that it contributed to the FIT rate with no derating, but was implemented in a latch type that had a high nominal FIT while a latch type of a lower nominal FIT was available. In other words, if latch type A is being used, is more vulnerable to soft errors than latch type B, and is contributing to the FIT rate, then latch type A is a defect. This defect would be stored in a defects database 418 and sent to the design entry 603. The designer would then either change the latch type, or make a conscious decision to leave it as is and accept the higher FIT contribution as a trade-off to other constraints, such as chip area, power, or operating frequency.

During chip FIT calculation 602, the algorithm first initializes chip FIT to zero, then iterates through all the latches in the design. Since the latch type is known, the nominal FIT looked up from a table based on the latch type for the particular technology of the netlist. The SLD is also based on a table look-up, for example the table in FIG. 3. The OLD for a latch may also be looked up if the OLD value is specified, otherwise it defaults to one. The TD may be calculated by detecting which clock is used to clock the latch. Once the clock is known, the period and duty cycle of the clock is determined from the clock definition file. This is then used to determine the TD for that particular latch. Each latch fit is calculated by multiplying the nominal fit with the SLD, the OLD and the TD. The chip SE FIT is calculated by summing all of the latch contributions. The chip SE FIT is then stored in a CHIP SER FIT database 419 which is sent to the design entry 603.

Figure 7:
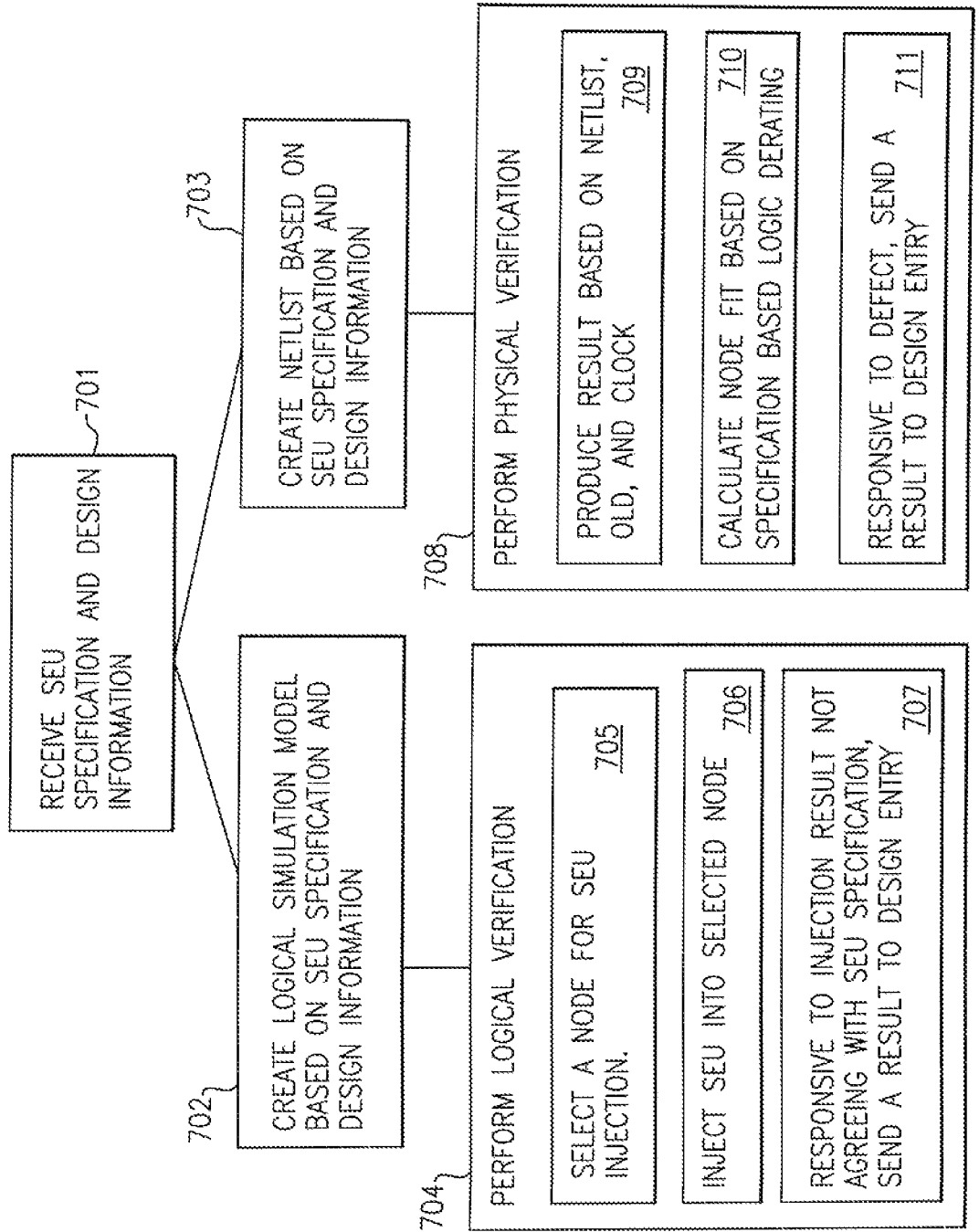
FIG. 7 illustrates an embodiment of a process incorporating one or more aspects of the present invention.

FIG. 7 illustrates an embodiment of a flow incorporating one or more aspects of the present invention. In 701, an SEU specification and design information is received. A logical simulation model is created based on the SEU specification and design information 702. Logical verification is then performed on based on the logical simulation model 704. During logical verification, a node is selected for SEU injection, 705. The node is then injected with an SEU to produce a logical verification result 706. If the logical verification result does not agree with the SEU specification, the logical verification result, which may include defects and experimentally determined attributes for the node as previously described above with respect to FIG. 5, is sent to the design entry 707.

A netlist is also created based on the SEU specification and design information 703. The netlist comprises a specification based logic derating derived from the SEU specification. A physical verification is performed based on the netlist, logic derating (for example the OLD), and clock information 709, which was previously described above with reference to FIG. 6, to produce a physical verification result. The physical verification result may include defects and a chip SE FIT, as previously described above with reference to FIG. 6. Producing the physical verification result may include calculating a node FIT 710 based on the specification based logic derating. A chip SE FIT may also be calculated by summing all selected node FITs as described previously above. The physical verification result is sent to the design entry.

Figure 8:
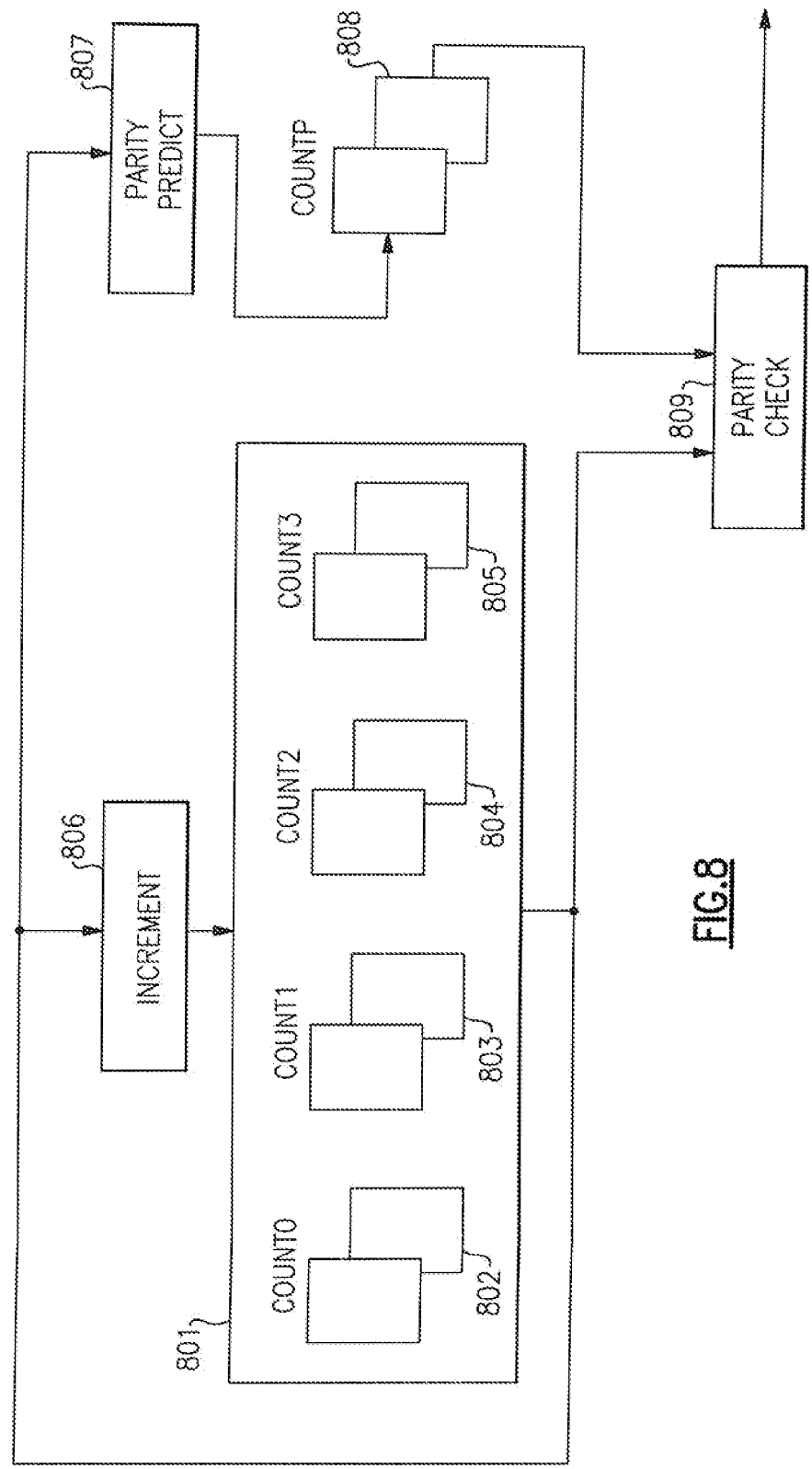
FIG. 8 illustrates an example of a counter with parity predict and check incorporating one or more aspects of the present invention.

FIG. 8 illustrates an example of a 4-bit counter with parity prediction and parity checking incorporating one or more aspects of the present invention. The four latches of the counter circuitry 801 are illustrated as latches named count( ) 802, count1 803, count2 804, and count3 805. The latches 802, 803, 804, 805 may be of any latch type. In this example, master-slave latches are used. A parity latch, countp 808, is also shown. This design illustrates an example of error detection, error correction, and self-healing attributes.

In this 4-bit counter circuit, the counter 802, 803, 804, 805 and parity 808 latches are all on the same clock, not shown in FIG. 8, running at some frequency. The counter 802, 803, 804, 805 and parity 808 latches updates at the same time. The 4-bit counter increments 806 every cycle. The value of the counter 801 is fed into a parity predict block 807, which computes what the parity should be in the next cycle based on the value of the counter in the current cycle and stores it in countp 808. With this scheme, the parity will always be correct every cycle, assuming the circuit is initialized in a state with correct parity. Parity will be incorrect only if a soft or hard error causes an error in either the counter 801 or countp 808 circuitry.

A parity checker 809 evaluates the value of the counter 801 and the parity every cycle, and if the parity is incorrect an error is reported to an error collection unit, not shown in FIG. 8.

Using the attributing scheme of FIG. 1, the correct attributing for latches 802, 803, 804, 805 would be EDY, ECN, SHN. If a SEU occurs on any of those four latches 802, 803, 804, 805, it will be detected by the parity checker 809. The error will not be corrected, because there is no mechanism in the increment circuit to correct errors. If the binary value of the counter were, for example, decimal 2, or 0010 binary, and an SEU caused the value to change to decimal 6 or binary 0110 in any given cycle, it would increment to decimal 7 in the next cycle, instead of decimal 3. The counter would be incorrect from that point on, until it was re-initialized. Therefore, it would neither correct, nor heal.

Suppose the latches 802, 803, 804, 805 had been attributed ECY, specifying that the latches 802, 803, 804, 805 would return to the correct value in the event of an SEU, and that the verification team performed the test case described above, where an SEU was injected to change the counter 801 from decimal 2 to 6. The test case would find that the counter 801 did not return to a correct value, and a defect would be opened against the design for improper specification.

Using the attributing scheme of FIG. 1, the correct attributing for the countp 808 latch would be EDY, ECN, SHY. Using the previous example, when the counter latches 802, 803, 804, 805 changed from 0010 to 0110, the parity checker 809 would detect the error. The parity would not be corrected, so ECN would be the correct attribute. However, the parity would heal for the next cycle because the parity predict logic 807 would correctly predict the parity value for the next cycle, based on the 0110 values. Although the counter 801 would be incorrect from the moment the soft error occurred, countp parity value 808 would be incorrect for only one cycle. After that, the countp parity value 808 would be correct for the counter latches 802, 803, 804, 805 for the future cycles.

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

As will be appreciated by one skilled in the art, the present invention may be embodied as a system, method or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "module" or "system." Furthermore, the present invention may take the form of a computer program product embodied in any tangible medium of expression having computer usable program code embodied in the medium.

Figure 9:
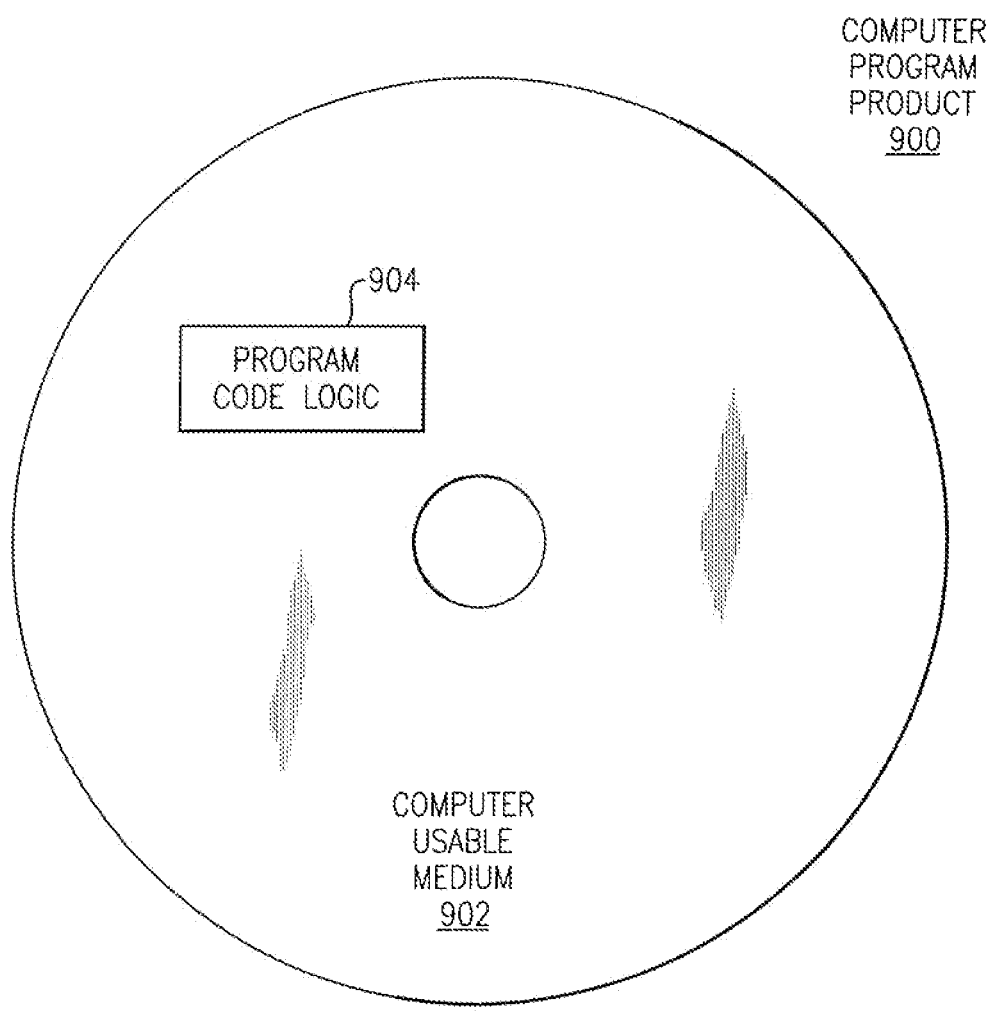
FIG. 9 illustrates one embodiment of a computer program product to incorporate one or more aspects of the present invention.

One example of a computer program product incorporating one or more aspects of an embodiment of the present invention is described with reference to FIG. 9. A computer program product 900 includes, for instance, one or more computer usable media 902 to store computer readable program code means or logic 904 thereon to provide and facilitate one or more aspects of an embodiment of the present invention. Any combination of one or more computer usable or computer readable medium(s) may be utilized. The computer-usable or computer-readable medium may be, for example but not limited to, an electronic, magnetic, optical, infrared, or semiconductor system, apparatus, or device. More specific examples (a non-exhaustive list) of the computer-readable medium would include the following: a portable computer diskette, a hard disk, a random access memory (RAM), a read-only memory (ROM), an erasable programmable read-only memory (EPROM or Flash memory), a portable compact disc read-only memory (CDROM), an optical storage device, or a magnetic storage device. In the context of this document, a computer-usable or computer-readable medium may be any storage medium that can contain 006Fr store the program for use by or in connection with the instruction execution system, apparatus, or device.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Figure 10:
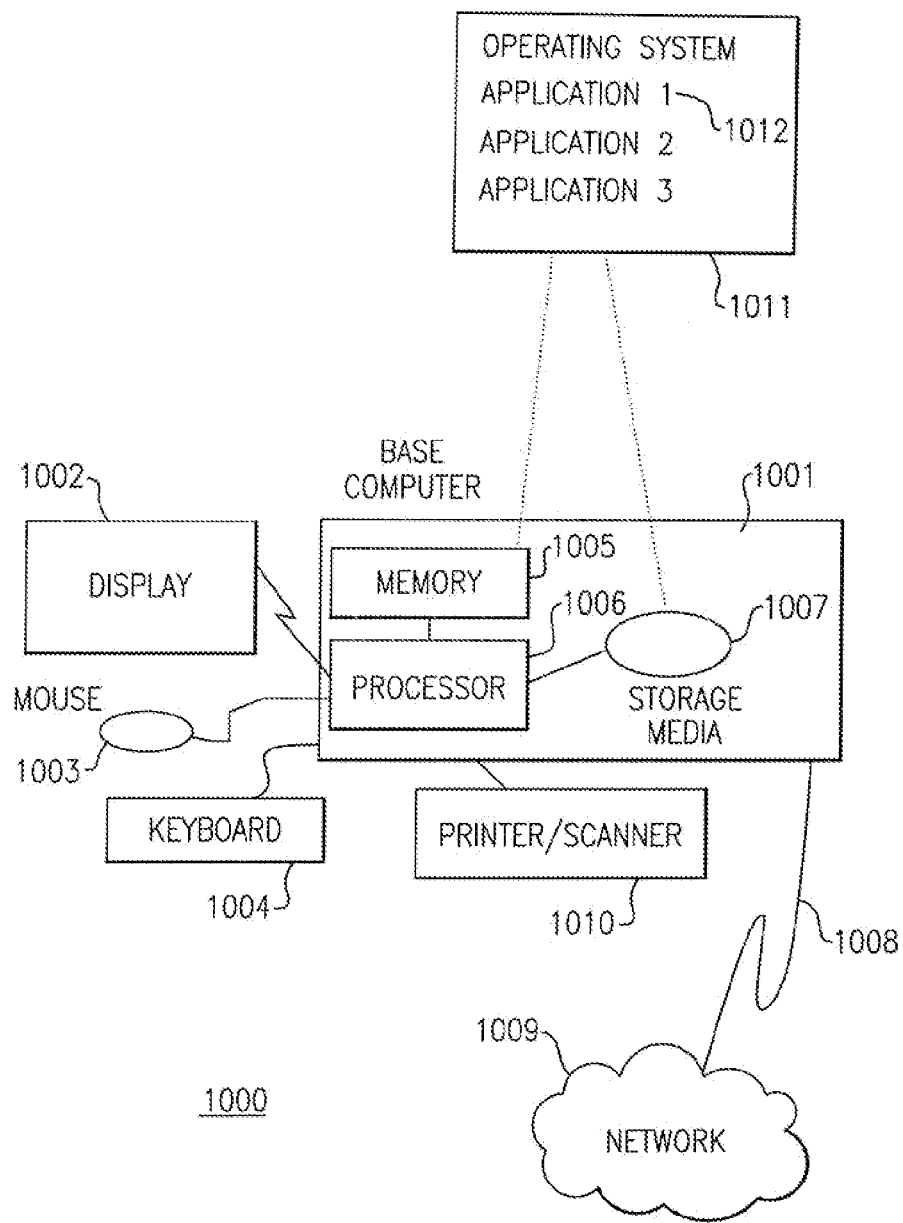
FIG. 10 illustrates one embodiment of a workstation system in which an embodiment of the present invention may be practiced.

FIG. 10 illustrates an embodiment of a workstation or server hardware system in which an embodiment of the present invention may be practiced. The system comprises a computer system 1001, such as a personal computer, a workstation or a server, including optional peripheral devices. The computer system 1001 includes one or more processors 1006 and a bus employed to connect and enable communication between the processor(s) 1006 and the other components of the computer system 1001 in accordance with known techniques. The bus connects the processor 1006 to memory 1005 and long-term storage 1007 which can include a hard drive (including any of magnetic media, CD, DVD and Flash Memory for example) or a tape drive for example. The computer system 1001 might also include a user interface adapter, which connects the microprocessor 1006 via the bus to one or more interface devices, such as a keyboard 1004, mouse 1003, a printer/scanner 1010 and/or other interface devices, which can be any user interface device, such as a touch sensitive screen, digitized entry pad, etc. The bus also connects a display device 1002, such as an LCD screen or monitor, to the microprocessor 1006 via a display adapter.

The computer system 1001 may communicate with other computers or networks of computers by way of a network adapter capable of communicating 1008 with a network 1009. For example, network adapters may include communications channels, token ring, Ethernet or modems. Alternatively, the computer system 1001 may communicate using a wireless interface, such as a CDPD (cellular digital packet data) card. The computer system 1001 may be associated with such other computers in a Local Area Network (LAN) or a Wde Area Network (WAN), or the computer system 1001 may be a client in a client/server arrangement with another computer, etc. All of these configurations, as well as the appropriate communications hardware and software, are known in the art.

Software programming code which embodies the present invention may be typically accessed by the processor 1006 from long-term storage media 1007. The software programming code may be embodied on any of a variety of known media for use with a data processing system, as previously described above with reference to FIG. 9. The code may be distributed on such media, or may be distributed to users from the memory or storage of one computer system over a network to other computer systems.

Alternatively, the programming code 1011 may be embodied in the memory 1005, and accessed by the processor 1006 using the processor bus. Such programming code may include an operating system which controls the function and interaction of the various computer components and one or more application programs 1012. Program code may be normally paged from storage media 1007 to memory 1005 where it may be available for processing by the processor 1006. The techniques and methods for embodying software programming code in memory, on physical media, and/or distributing software code via networks are well known and will not be further discussed herein. The computer program product medium may be typically readable by a processing circuit preferably in a computer system for execution by the processing circuit.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow.

What is claimed is:

1. A computer implemented method for soft error modeling of circuits, the method comprising:
    receiving a soft error (SE) specification and design information from a design entry, wherein said SE specification comprises expected SE behavior of a node;
    creating a logical simulation model based on said SE specification and said design information; and
    performing a logical verification based on said logical simulation model to produce a first result, wherein performing said logical verification comprises:
    selecting a first node for injection;

injecting an SE into said first node to produce a first result; and based on said first result differing from said expected SE behavior in said SE specification, providing said first result to said design entry;

creating a netlist based on said SE specification and said design information, wherein said netlist comprises a specification-based-logic-derating derived from said SE specification; and performing a physical design verification based on said netlist, a logic derating, and clock information, said performing a physical design verification comprising calculating node failure-in-time (FIT) based on said specification-based-logic-derating.

2. The computer implemented method according to claim 1, wherein said first result consists of any one of a logical defects result, an experimentally determined attributes result, or a verification result.

3. The computer implemented method according to claim 1, further comprising:

producing a second result responsive to said performing a physical design verification, wherein said second result comprises one of a physical defects result or a calculated circuit soft-error-rate-failure-in-time-rating, wherein said calculated circuit soft-error-rate-failure in-time-rating comprises summing said node failure-in-time; and providing said second result to said design entry.

4. The computer implemented method according to claim 1, wherein said netlist comprises a node type.

5. The computer implemented method according to claim 1, wherein said node is any one of a latch, a wire, a transistor gate, a logic element, a memory array, or a register array.

6. The computer implemented method according to claim 1, wherein performing said logical verification further comprises comparing said SE specification with a behavior of said injected SE node.

7. The computer implemented method according to claim 1, wherein said SE specification comprises an attribute selected from the group consisting of a self healed attribute, an error correction attribute, and an error detection attribute.

8. A computer program product for soft error modeling of circuits, the computer program product comprising:

a storage medium readable by a processing circuit and storing instructions for execution by the processing circuit for performing a method comprising:

receiving a soft error (SE) specification and design information from a design entry, wherein said SE specification comprises expected SE behavior of a node;

creating a logical simulation model based on said SE specification and said design information; and performing a logical verification based on said logical simulation model to produce a first result, wherein performing said logical verification comprises:

selecting a first node for injection;

injecting an SE into said first node to produce a first result; and based on said first result differing from said expected SE behavior in said SE specification, providing said first result to said design entry;

creating a netlist based on said SE specification and said design information, wherein said netlist comprises a specification-based-logic-derating derived from said SE specification; and performing a physical design verification based on said netlist, a logic derating, and clock information, said performing a physical design verification comprising calculating node failure-in-time (FIT) based on said specification-based-logic-derating.

9. The computer program product according to claim 8, wherein said first result consists of any one of a logical defects result, an experimentally determined attributes result, or a verification result.

10. The computer program product according to claim 8, further comprising:

producing a second result responsive to said performing a physical design verification, wherein said second result comprises one of a physical defects result or a calculated circuit soft-error-rate-failure-in-time-rating, wherein said calculated circuit soft-error-rate-failure in-time-rating comprises summing said node failure-in-time; and providing said second result to said design entry.

11. The computer program product according to claim 8, said wherein said netlist comprises a node type.

12. The computer program product according to claim 8, wherein said node is any one of a latch, a wire, a transistor gate, a logic element, a memory array, or a register array.

13. The computer program product according to claim 8, wherein performing said logical verification further comprises comparing said SE specification with a behavior of said injected SE node.

14. The computer program product according to claim 8, wherein said SE specification comprises an attribute selected from the group consisting of a self healed attribute, an error correction attribute, and an error detection attribute.

15. A system for soft error modeling of circuits comprising:

a memory;

a processor in communications with said memory, said processor configured to perform a method comprising:

receiving, by a processor, a soft error (SE) specification and design information from a design entry, wherein said SE specification comprises expected SE behavior of a node;

creating, by a processor, a logical simulation model based on said SE specification and said design information; and performing, by a processor, a logical verification based on said logical simulation model to produce a first result, wherein performing said logical verification comprises:

selecting, by a processor, a first node for injection;

injecting, by a processor, an SE into said first node to produce a first result; and based on said first result differing from said expected SE behavior in said SE specification, providing, by a processor, said first result to said design entry;

creating, by a processor, a netlist based on said SE specification and said design information, wherein said netlist comprises a specification-based-logic-derating derived from said SE specification; and performing, by a processor, a physical design verification based on said netlist, a logic derating, and clock information, said performing a physical design verification comprising calculating node failure-in-time (FIT) based on said specification-based-logic-derating.

16. The system according to claim 15, wherein said first result consists of any one of a logical defects result, an experimentally determined attributes result, or a verification result.

17. The system according to claim 15, said method further comprising:
    producing, by a processor, a second result responsive to said performing a physical design verification, wherein said second result comprises one of a physical defects result or a calculated circuit soft-error-rate-failure-in-time-rating, said calculated circuit soft-error-rate-failure in-time-rating comprising summing said node failure-in-time; and
    providing, by a processor, said second result to said design entry.

* * * * *